US012647027B2

(12) United States Patent
Morgan

(10) Patent No.: US 12,647,027 B2
(45) Date of Patent: Jun. 2, 2026

(54) SWITCHING DRIVERS WITH CAPACITIVE VOLTAGE GENERATION OPERABLE IN DIFFERENT CAPACITOR BIASING REGIMES

(71) Applicant: Cirrus Logic International Semiconductor Ltd., Edinburgh (GB)

(72) Inventor: Ross C. Morgan, Bathgate (GB)

(73) Assignee: Cirrus Logic Inc., Austin, TX (US)

( * ) Notice: Subject to any disclaimer, the term of this patent is extended or adjusted under 35 U.S.C. 154(b) by 131 days.

(21) Appl. No.: 18/448,527

(22) Filed: Aug. 11, 2023

(65) Prior Publication Data

US 2025/0055370 A1     Feb. 13, 2025

(51) Int. Cl.
H02M 3/07          (2006.01)
H03F 3/217         (2006.01)
(52) U.S. Cl.
CPC ............. H02M 3/07 (2013.01); H03F 3/2173 (2013.01); H03F 2200/03 (2013.01)
(58) Field of Classification Search
CPC ............................................. H02M 3/07–078
See application file for complete search history.

(56) References Cited

U.S. PATENT DOCUMENTS

| | | | |
|---|---|---|---|
| 2019/0229623 A1* | 7/2019 | Tsuda .................... | H02M 3/073 |
| 2020/0091816 A1 | 3/2020 | De Cremoux | |
| 2020/0099229 A1* | 3/2020 | Jeong ............... | G01R 19/16519 |

FOREIGN PATENT DOCUMENTS

| | | |
|---|---|---|
| GB | 2510395 A | 6/2014 |
| WO | 2022243674 A1 | 11/2022 |

OTHER PUBLICATIONS

Combined Search and Examination Report under Sections 17 and 18(3), UKIPO, Application No. GB2408279.4, dated Nov. 28, 2024.

* cited by examiner

*Primary Examiner* — Peter M Novak
(74) *Attorney, Agent, or Firm* — Jackson Walker L.L.P.

(57)          ABSTRACT
This application relates to switching drivers which receive a supply voltage that can vary in use. An output stage switches a driver output node between switching voltages with a controlled duty-cycle and is operable in different driver modes in which the switching voltages are different in the different driver modes. A capacitive voltage generator is operable to generate a switching voltage used in one of the driver modes. The switching driver is operable a first regime, in which a capacitor of the voltage generator is biased to a capacitor voltage with a magnitude greater than the input supply voltage, or a second regime, where the biasing of the capacitor is different, such that the capacitor voltage magnitude has a ratio to the input supply voltage with a lower value than in the first regime. The regime is controlled based on the magnitude of the supply voltage and/or the capacitor voltage.

20 Claims, 3 Drawing Sheets

SWITCHING DRIVERS WITH CAPACITIVE VOLTAGE GENERATION OPERABLE IN DIFFERENT CAPACITOR BIASING REGIMES

FIELD OF DISCLOSURE

The field of representative embodiments of this disclosure relates to methods, apparatus and/or implementations concerning or relating to switching driver or amplifier circuits with capacitive voltage generation as may be used to drive a transducer, and in particular to switching driver circuits with capacitive voltage boosting.

BACKGROUND

Many electronic devices include transducer driver circuitry for driving a transducer with a suitable driving signal, for instance for driving an audio output transducer of the host device or a connected accessory, with an audio drive signal. In some applications, the driver circuitry may include a switching driver, e.g. a class-D amplifier output stage or the like, for generating the output drive signal. Switching drivers, sometimes referred to as switched-mode drivers or switched-mode amplifiers, can be relatively power efficient. A switching driver generally operates to switch an output node between different switching voltages, with a duty cycle that provides a desired average output voltage, over the course of one or more switching cycles, for the drive signal.

For some applications, it may be desirable for the switching driver to be operable to use a switching voltage with a magnitude greater than an input supply voltage to the switching driver. For example, in some applications, it may be desirable to be able to generate the drive signal with a relatively high magnitude, e.g. to be able to drive certain types of transducers that require relatively high driving voltages and/or to achieve relatively high output powers. To generate such a switching voltage, the switching driver may include a voltage generator and switching drivers using capacitive voltage generation have been proposed, i.e. where at least one capacitor is charged to a capacitor voltage and then connected with a supply voltage to provide level shifting, e.g. boosting, of the supply voltage. In some implementations, to provide the desired output range, at least one capacitor may be charged to a capacitor voltage which is greater than the magnitude of the supply voltage, e.g. to a voltage which is double or a higher multiple of the supply voltage. In this case, the relevant capacitor should be selected to be able to safely handle the maximum expected voltage in use, which may require the use of capacitors with a relatively high voltage tolerance, which may be relatively expensive.

SUMMARY

Embodiments of the present disclosure relate to methods and apparatus for current monitoring that at least mitigate at least some of the above-mentioned issues.

According to an aspect of the disclosure there is provided a switching driver for driving a load with an output drive signal based on an input signal. The switching driver comprises a supply input node configured to receive an input supply voltage that can vary in use and an output stage configured to switch at least one driver output node between selected switching voltages with a controlled duty-cycle so as to generate the output drive signal at the at least one driver output node, wherein the output stage is operable in a plurality of different driver modes in which the switching voltages are different in the different driver modes. The switching driver also comprises a capacitive voltage generator comprising capacitor nodes for connection, in use, to a capacitor, the capacitive voltage generator being operable to generate one of the switching voltages used in one of the driver modes. The switching driver is configured to be operable in: a first regime in which, in at least one driver mode, the capacitor is biased to a capacitor voltage with a magnitude greater than the input supply voltage and which has a ratio to the magnitude of input supply voltage with a first value; and in a second regime in which the biasing of the capacitor is different to that of the first regime, such that the capacitor voltage has a magnitude that has a ratio to the input supply voltage with a value which is lower than the first value. A regime controller is configured to control the regime of the switching driver, so as to selectively operate in the first regime or the second regime, based on at least one of the magnitude of the input supply voltage and the magnitude of the capacitor voltage.

In some examples, the regime controller may be configured to control the regime of the switching driver based on the magnitude of the input supply voltage and the regime controller may comprise a first comparator for comparing an indication of the input supply voltage to a voltage threshold and a control block responsive to the first comparator for outputting a regime control signal to control the regime of the switching driver. The regime controller may be configured to control the switching driver to operate in the second regime if the indication of the input supply voltage exceeds the voltage threshold. In some implementations, a latency of the first comparator and the control block with respect to the input system voltage reaching the voltage threshold and the control block outputting a control signal to control the switching driver to operate in the second regime may be 2 microseconds or less. The regime controller may be configured such that, when operating in the second regime, the regime controller is configured to control the switching driver to swap to the first regime, if the indication of the input supply voltage drops below the voltage threshold and also an indication of loading of the switching driver does not exceed a loading threshold. The regime controller nay be further configured to receive an indication of a monitored current, wherein the monitored current is one of an input current to the switching driver from the supply input node or an output current from the switching driver to the load, and the regime controller may be configured to control the switching driver to swap from the second regime to the first regime if the indication of the input supply voltage drops below the voltage threshold and also the indication of monitored current does not exceed a current threshold for a defined time period. In some examples, the regime controller may further comprise a second comparator for comparing the indication of monitored current to the current threshold and a timer for timing the defined time period.

In some examples, the switching driver may be configured such that, in the first regime, the capacitor is biased to a capacitor voltage with a magnitude which is a multiple, greater than one, of the magnitude of the input supply voltage. The switching driver may be configured such that, in the first regime, the capacitor is biased to a capacitor voltage with a magnitude which is twice the magnitude of the input supply voltage. In some examples, in the first regime, the capacitive voltage generator may be operable to generate a voltage equal to $-2VP$ for use as one of the switching voltages.

In some examples, the switching driver may be configured such that, in the second regime, the capacitor is biased to a capacitor voltage with a magnitude equal to the magnitude of the input supply voltage. In other examples, the switching driver may be configured such that, in the second regime, the capacitor maintains its previous voltage from a period of operation in the first regime. In further examples, the switching driver maybe configured such that, in the second regime, the capacitor is biased to a capacitor voltage of zero.

In some examples, the switching driver may further comprise at least one additional capacitive voltage generator comprising at least one additional capacitor, and the switching driver may be configured such that the at least one additional capacitor is biased to a voltage with a magnitude equal to the magnitude of the input supply voltage in each of the first regime and the second regime.

The switching driver may be configured as an audio driver, wherein the output drive signal is an audio output signal and the load is an audio output transducer. The switching driver may be implemented as an integrated circuit.

An electronic device may comprise the switching driver and a power management circuitry configured to provide the input supply voltage for the switching driver. The power management circuitry may be configured to be operable in a first power mode in which the input supply voltage for the switching driver is derived from a battery of the electronic device and is in a first voltage range and in a second power mode in which the input supply voltage for the switching driver is derived from a power source external to the electronic device and is in a second voltage range, higher than the first voltage range. The regime controller may be configured to control the switching driver to operate in the first regime when the power management circuitry is operating in the first power mode and to control the switching driver to operate in the second regime when the power management circuitry is operating in the second power mode. The second power mode may be a pass-through power mode in which a voltage derived from the power source external to the electronic device is used to provide the input supply voltage for the switching driver without charging the battery.

In another aspect there is provided a switching driver for driving a load with an output drive signal based on an input signal comprising: a supply input node configured to receive an input supply voltage that can vary in use; and an output stage configured to switch at least one driver output node between selected switching voltages with a controlled duty-cycle so as to generate the output drive signal at the at least one driver output node, wherein the output stage is operable in a plurality of different driver modes in which the switching voltages are different in the different driver modes. The switching driver comprises a capacitor configured as part of a capacitive voltage generator for generating a voltage that can be used as a switching voltage, wherein, in use, the capacitor is biased to a capacitor voltage; and the switching driver is configured such that biasing of the capacitor is dynamically varied in use based on the magnitude of input supply voltage to vary the relationship between the capacitor voltage and the input supply voltage.

In a further aspect there is provided a switching driver for driving a load with an output drive signal based on an input signal comprising: an output stage configured to switch at least one driver output node between selected switching voltages with a controlled duty-cycle so as to generate the output drive signal at the at least one driver output node, wherein the switching driver comprises a capacitor configured as part of a capacitive voltage generator for generating a voltage that can be used as a switching voltage. The switching driver is configured to be operable: in a first regime in which the capacitor is biased to a capacitor voltage such that a ratio of the capacitor voltage to an input supply voltage has a first value; and in a second regime in which a ratio of the capacitor voltage to the input supply voltage has a value lower than the first value. The switching driver is configured to selectively operate in the first regime or second regime based on whether the capacitor voltage when operating in the first regime would exceed a capacitor voltage limit.

It should be noted that, unless expressly indicated to the contrary herein or otherwise clearly incompatible, then any feature described herein may be implemented in combination with any one or more other described features.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Embodiments of the disclosure relate to switching drivers with capacitive voltage generation and in particular to switching drivers operable such that a capacitor, which is used for voltage generation, can be charged to a capacitor voltage with a magnitude greater than an input supply voltage, where the input supply voltage for the switching driver may vary in use.

Figure 1:
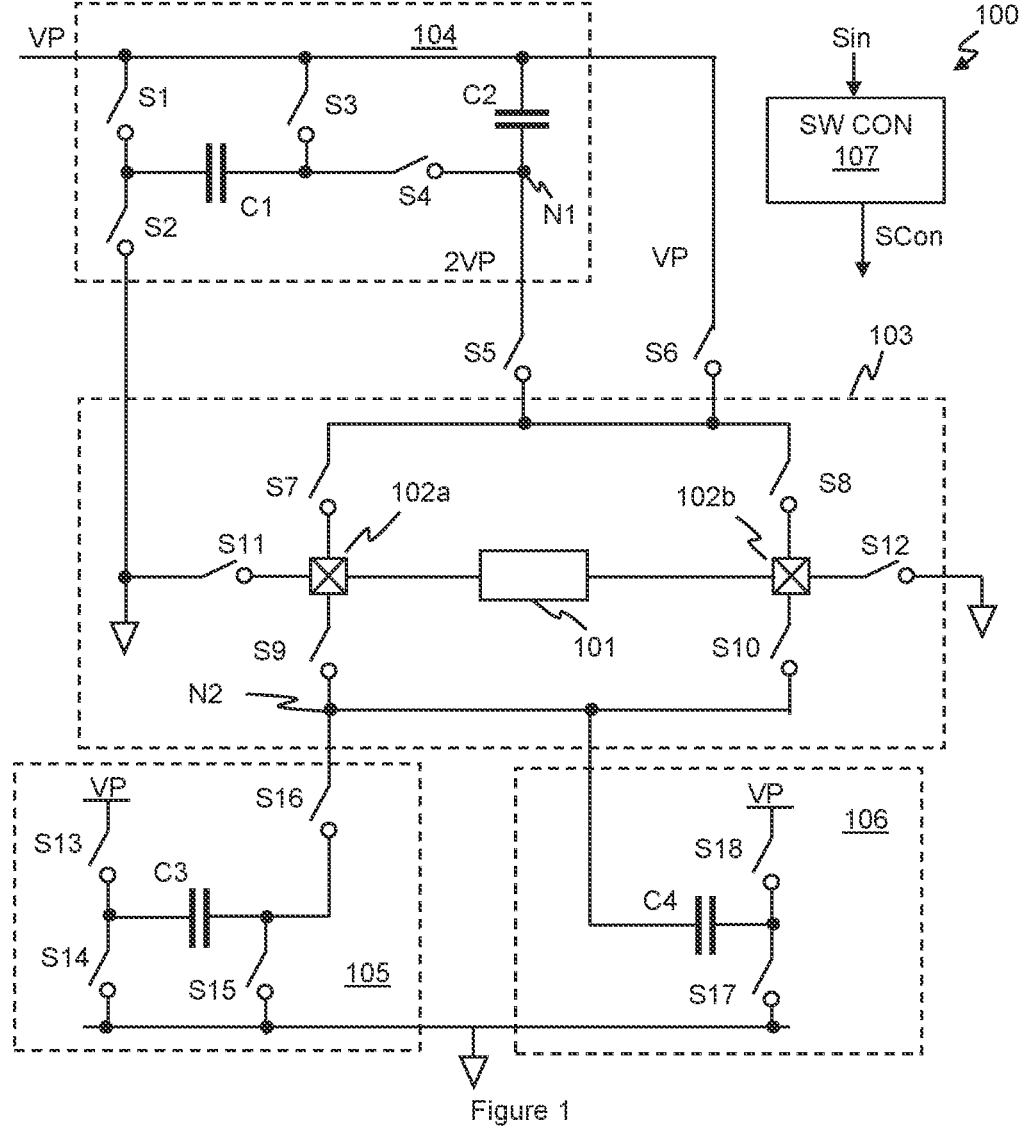
FIG. 1 illustrates one example of a switching driver with capacitive voltage generation.

FIG. 1 illustrates one example of a switching driver 100 with capacitive voltage generation that has previously been proposed. The switching driver 100 is configured to, in use, drive a load 101 with an output drive signal based on an input signal Sin. The load 101 may be a transducer and, in some cases, could be an audio output transducer such as a loudspeaker or a haptic output transducer such as a linear resonant actuator, although other types of load may be driven in other applications.

The switching driver 100 of FIG. 1 is configured to drive the load in a bridge-tied-load (BTL) configuration and thus the load 101 is, in use, connected between first and second output nodes 102a and 102b of an output stage 103 of the switching driver. In operation, the switching driver 100 switches each of the first and second output nodes 102a and 102b between selected switching voltages with controlled duty-cycles so as to generate, on average over the course of one or more switching cycles, the desired output voltage across the load 101. It will be understood, however, that the switching driver could alternatively be configured to drive the load 101 in a single-ended configuration, in which case one side of the load would be modulated between selected switching voltages with a controlled duty-cycle and the other side of the load would be held at a fixed DC voltage.

The switching driver 100 receives system voltages, which in this example, are a system supply voltage, VP, and ground. These system voltages define the input voltage for the switch driver, which in this example is equal to VP.

As noted above, in some applications it may be desirable to be able to output a driving signal with a greater magnitude than the input supply voltage. For instance, for portable electronic devices, the system voltage VP may, in at least some use cases, be derived from a battery, such as a lithium-ion battery or similar. The open circuit voltage (OCV) of such a battery may vary depending on the level of charge. Purely as an example, the OCV may, for instance, be around 4.5V or so at full charge but may drop to around 3.5V or so when nearly discharged. In some applications it may be desirable to generate the output drive signal to have a much larger magnitude, say in the range of +10V to –10V or greater.

Thus, the switching driver 100 is configured to capacitively generate additional voltages that can be used as switching voltages, so as to enable higher magnitude driving signals.

The switching driver 100 of the example of FIG. 1 comprises a first capacitive voltage generator 104, which in this example is a 2× (times two) charge pump 104, which receives the system voltages VP and ground, and which generates an additional voltage, which in this example is equal to +2VP.

The charge pump 104 comprises a capacitor C1, arranged as a flying capacitor with switches S1, S2, S3 and S4, and also a capacitor C2, arranged as a reservoir or hold capacitor. Switches S1 and S2 selectively connect a first terminal of the capacitor C1 to the system voltage VP and ground respectively, whilst switch S3 selectively connects a second terminal of capacitor C1 to system voltage VP and switch S4 selectively couples the second terminal of capacitor C1 to a charge pump output node N1.

In use, switches S2 and S3 are switched together and in antiphase with switches S1 and S4. The charge pump 104 thus cycles between a first state, with switches S2 and S3 closed (and switches S1 and S4 open), to charge the flying capacitor C1 to the input voltage VP with the second terminal being positive, and a second state with switches S1 and S4 closed (and switches S1 and S4 open), such that the system voltage VP is connected to the first terminal of capacitor C1 and the second terminal of capacitor C1 is boosted to 2VP. This state charges the reservoir capacitor C2, connected between the system voltage VP and the charge pump output node N1, and thus provides an output voltage of 2VP, which is maintained by the hold capacitor C2.

It will be understood that in this arrangement, the flying capacitor C1 is thus repeatedly charged to the input voltage, VP, so that the capacitor voltage of C1, i.e. the voltage across capacitor C1, is equal to VP. The reservoir capacitor C2 is coupled between the charge pump output node N1 and the system voltage VP and thus the capacitor voltage across capacitor C2 is also equal to the input voltage VP.

The switches S1 to S4 of the charge pump 104 are switched at a charge pump frequency which is independent of the output signal being output by the driver apparatus, and which is thus independent of the duty cycles at the first and second output nodes 102a and 102b.

In the example of FIG. 1, the 2VP output voltage from the charge pump 104 or the system voltage VP may be respectively coupled to a common-rail of the output stage 103, which may be referred to as a high-side rail, by switches S5 and S6 respectively. Each of the first and second output nodes 102a and 102b may be selectively connected to the high-side rail by respective switches S7 and S8. The first and second output nodes 102a and 102b can also be selectively connected to a common rail, which will be referred to as a low-side rail, by respective switches S9 and S10. The first and second output nodes 102a and 102b can also be selectively connected to the system ground voltage by respectively switches S11 and S12. The output stage 103 may thus be referred to as a T-bridge stage.

The driver apparatus 100 also comprises second and third capacitive voltage generators 105 and 106 for selectively generating voltages of –VP or –2VP at the low-side rail.

The second capacitive voltage generator 105 comprises a flying capacitor C3 and switches S13 and S14 for selectively connecting a first terminal of the flying capacitor C3 to the system voltage VP or ground respectively, and switches S15 and S16 for selectively connecting the second terminal of capacitor C3 to ground or to a node N2 respectively. The node N2 is coupled to (or forms part of) the low-side rail. In use, switches S13 and S15 are switched together and in antiphase with switches S15 and S16. The second capacitive voltage generator 105 thus cycles between a first state, with switches S13 and S15 closed (and switches S14 and S16 open), to charge the flying capacitor C3 to the voltage VP with the first terminal being positive, and a second state with switches S14 and S16 closed (and switches S13 and S15 open), such that the first (more positive) terminal of capacitor C1 is connected to system ground and the second terminal of capacitor C1, and hence the node N2 and the low-side rail, is driven to –VP.

The third capacitive voltage generator 106 comprises switches S17 and S18 and flying capacitor C4. Switches S17 and S18 selectively connect a first terminal of capacitor C4 to ground or VP respectively, whilst a second terminal of capacitor C4 is connected to the node N2 (in this case via the low-side rail). The node N2 can thus be seen as a common output node for the second and third voltage generators. The third capacitive voltage generator 106 is configured to be operable, together with the second capacitive voltage generator 105, to generate a voltage of –2VP at the node N2 and hence at the low-side rail.

When the second capacitive voltage generator 105 is in its second state, with the low-side rail driven to –VP, switch 18 can be closed (with switch S17 open) so as to charge capacitor C4 to a capacitor voltage of 2VP, with the first terminal being positive. When the second capacitive voltage generator 105 is in the second state discussed above, with switch S16 open, switch S17 can be closed (with switch S18 open) so as to connect the second (more positive) terminal of the capacitor C4 to system ground, which thus drives node N2 and the low-side rail to a voltage of –2VP.

The second and third capacitive voltage generators 105 and 106 can thus be operated together to modulate the low-side rail between voltages of –VP and –2VP. It will be understood that, in the example of FIG. 1, these voltage generators do not comprise hold or reservoir capacitors to maintain the output voltage and thus the relevant voltage is generated at the high-side rail for just part of the switching cycle.

In use, the capacitor C3 is thus charged to a capacitor voltage with a magnitude of VP and the capacitor C4 is charged to a capacitor voltage with a magnitude of 2VP. The capacitor voltage of the capacitor C4 is thus greater than the magnitude of the input voltage VP and in this example is a multiple (greater than one) of the input voltage.

In use, the various switches S5 to S18 of the switching driver 100 are controlled by a switch controller 107 based on the input signal Sin, for example an input audio signal, to generate a corresponding differential output drive signal. For the switching apparatus 100 as previously proposed, the switch controller 107 is configured to selectively operate the driver apparatus in different driver modes of operation to provide the differential output drive voltage in the range of +4VP to −4VP based on the input signal Sin. The switch controller 107 thus receives the input signal Sin and generates a series of switch control signals Scon for controlling the switches. The switch controller 107 may also control the switches S1-S4 of the charge pump 104 but the control of these switches may be independent of the input signal Sin.

For a relatively low-magnitude output signal, i.e. for a differential output magnitude below a first threshold, where the first threshold is a magnitude of VP or lower, the driver apparatus 100 can be operated in a first mode, referred to as Mode 1, in which each of the first and second output nodes 102a and 102b is switched between the system supply voltage VP and ground.

In this Mode 1 operation, switch S6 is closed to connect the system supply voltage VP to the high-side rail and switch S5 is open to disconnect the output of the charge pump 104 from this high-side rail. Switches S9 and S10 are also open to disconnect the output nodes from the low-side rail. The switches S7 and S11 are switched in antiphase with a controlled duty-cycle to switch the first output node 102a between the voltage VP (at the high-side rail) and ground. Likewise the switches S8 and S12 are also switched with a controlled duty cycle for the second output node 102b.

For a higher intermediate magnitude output signal, i.e. for a differential output magnitude between the first threshold and a second higher threshold, where the second threshold is a magnitude of 2VP or lower, the driver apparatus 100 can be operated in a second mode, which will be referred to as Mode 2, in which one of the first and second output nodes 102a and 102b (depending on the required polarity) is switched between voltages VP and ground and the other output node is switched between voltages −VP and ground.

If the polarity of the differential output is defined as being positive when the voltage at the first output node 102a is more positive that the voltage at the second output node 102b, then for a positive output signal in the Mode 2, the first output node 102a would be switched between VP and ground, whilst the second output node 102b is switched between −VP and ground. In this case, switch S6 is again closed to connect the input voltage VP to the high-side rail, with switch S5 open, and switches S7 and S11 are again switched with a controlled duty-cycle, with switch S9 open.

Switch S8 is open throughout the switching cycle to isolate the second output node 102b from the high-side rail. The second capacitive voltage generator 105 may be operated to generate the voltage −VP at the low-side rail with an appropriate duty-cycle for the second output node 102b. Switch S10 and S12 may be switched in antiphase with switch S10 being switched in synchronism with the low-side rail being at −VP.

For a still higher intermediate magnitude output signal, i.e. for a differential output magnitude between the second threshold and a third higher threshold, where the third threshold is a magnitude of 3VP or lower, the driver apparatus 100 can be operated in a third mode, referred to herein as Mode 3, in which one of the first and second output nodes 102a and 102b (depending on the required polarity) is switched between voltages 2VP and VP and the other output node is switched between voltage −VP and ground.

For a positive differential output, the first output node 102a may be switched between the voltages 2VP and VP. In this case, switch S7 is closed throughout the switching cycle to connect the output node to the high-side rail (with switches S9 and S11 open) and the switches S5 and S6 are switched to switch the voltage at the high-side rail between VP and 2VP with a controlled duty cycle appropriate for the first output node 102a. The switching of second output node 102b operates in the same manner as in Mode 2.

For a still higher magnitude output signal, i.e. for a differential output magnitude above the third threshold, the driver apparatus 400 can be operated in a fourth mode, which will be referred to as Mode 4, in which one of the first and second output nodes 102a and 102b (depending on the required polarity) is switched between voltages 2VP and VP and the other output node is switched between voltage −VP and −2VP.

For a positive differential output, the first output node 102a may be switched between the voltages 2VP and VP. In this case, switch S7 is closed throughout the switching cycle to connect the output node to the high-side rail (with switches S9 and S11 open) and the switches S5 and S6 are switched with a controlled duty cycle to switch the voltage at the high-side rail between 2VP and VP in a similar fashion as in Mode 3.

The second output node 102b is connected to the low-side rail with switch S10 closed (and switches S8 and S12 open) throughout the switching cycle. In this case, the second and third capacitive voltage generators 105 and 106 cooperate to switch the voltage at the low-side rail between −VP and −2VP with a duty-cycle appropriate for the second output node 102b.

Note that for Modes 2, 3 and 4, operation has been described in the context of a positive output drive signal. For a negative output drive signal the operation of the first and second output nodes 102a and 102b would be reversed.

It will be understood that in Mode 1, only the system supply voltage VP and ground are used as switching voltages and none of the voltages generated by the capacitive voltage generators are used. One or more of the first, second and third capacitive voltage generators 104, 105 and 106 could be disabled when operating in the mode, but in the switching driver as previously proposed, it is preferable to operate at least the second capacitive voltage generator 105 at some nominal frequency in this mode to ensure that flying capacitor C3 is maintained with the required capacitor voltage equal to VP to enable operation in Mode 2 if the magnitude of the signal increases above the relevant threshold. The third capacitive voltage generator 106 may be operated in combination with the second capacitive voltage generator 105 as discussed above to also keep the capacitor C4 charged to the required capacitor voltage of 2VP. Alternatively, to keep the capacitor C4 charged to the voltage of 2VP, the capacitor C4 may be connected between the voltage 2VP generated by the charge pump 104 and ground (but this would require some additional switches to provide the relevant connection and disconnect the capacitor C4 from the low-side rail). In either case, this ensures that the capacitor C4 can be used to generate the voltage of −2VP in Mode 4 when required.

Thus, for the switching driver as previously proposed, the second and third capacitive voltage generators 105 and 106 may be operational in each of the operating modes, and thus capacitor C4 may be repeatedly charged to the voltage 2VP. The capacitor C4 should thus be selected to be one that can be safely charged to the required capacitor voltage, i.e. with a rating for tolerating capacitor voltages to at least 2VP.

In at least some applications, however, the system voltage VP may vary in use.

As discussed above, in some use cases the voltage VP may be derived from a battery, such as a lithium-ion battery, and the OCV of the battery may vary depending on the charge state of the battery, for example in a range from about 4.5V at full-charge down to about 3.5V at low charge. The system voltage VP may thus vary with this battery voltage. In addition, in such portable electronic devices it may also be usual for the device to be operable using external sources of power.

Figure 2:
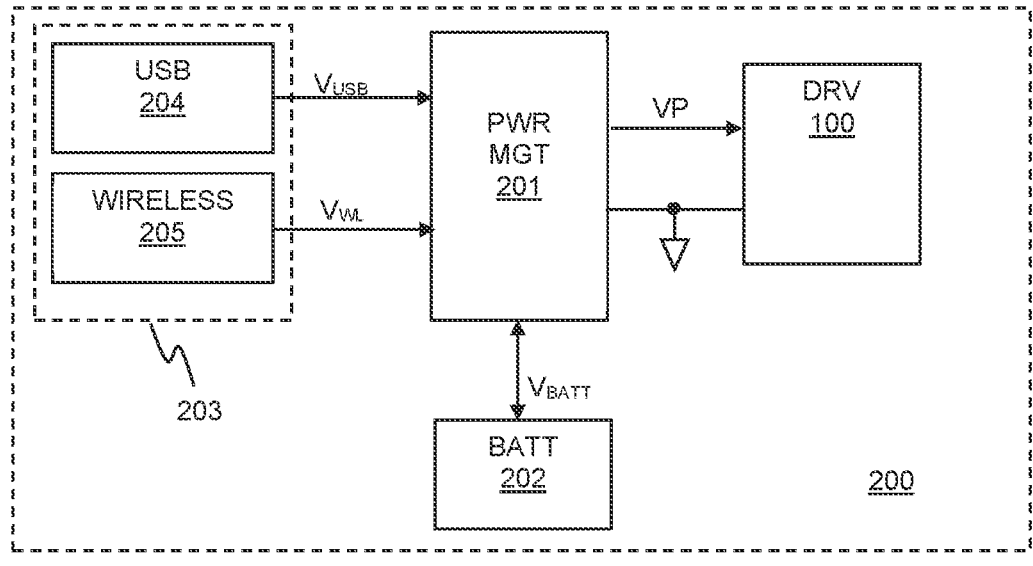
FIG. 2 illustrates an electronic device operable with different power supplies.

FIG. 2 illustrates this principle. FIG. 2 illustrates an electronic device 200 that includes a switching driver 100 such as discussed with reference to FIG. 1. FIG. 2 illustrates that the device 200 also comprises power management circuitry 201 for managing different power supplies for the device.

In the example of FIG. 2, the device comprises a battery 202 which is capable of providing a battery voltage $V_{BATT}$ to the power management circuitry 201, which can be used as the system voltage VP. As discussed, this battery voltage $V_{BATT}$ may vary in use with battery charge state and, in some examples, could vary in a range from about 4.5V to 3.5V.

The example of FIG. 2 also indicates the device has some charging circuitry 203 for receiving an external source of power, which can be used for charging the battery 202. In the example of FIG. 2, the charging circuitry comprises a USB charger 204 for receiving a voltage $V_{USB}$ from a suitable USB connection and a wireless charger 205 comprising a power coil for inductive charging to generate a voltage $V_{WL}$, although it will be understood that some examples may not have both of these chargers and/or could have alternative or additional chargers, such as a charger for receiving a mains voltage from a suitable adapter. The voltage $V_{USB}$ received from the USB charger may depend on the type of external USB power source. Older USB power sources may typically provide a voltage around 5V, say up to about 5.5V, whereas for newer USB power sources the voltage $V_{USB}$ could be of the order of tens of volts, say around 20V or more. For a wireless charger the voltage could also be of the order of tens of volts, say 30V or so. When the relevant charge voltage is of the order of tens of volts it will generally be stepped down to an appropriate lower voltage under control of the power management circuitry 201.

In use with such external charging sources, the power management circuitry 201 may use the relevant charge voltage (stepped-down as necessary) to provide a suitable voltage for both charging the battery 202 and providing the system voltage VP. For the example of a lithium-ion battery discussed above, when charging the battery, the charging voltage may typically be in the range of around 3.6V to 4.4V. As noted, this voltage is also used as the system voltage and thus VP, in such a use case, would also tend to be in this voltage range.

However, once the battery is fully charged, the power management circuitry 201 may disconnect the charging circuitry 203 from battery 202 and operate in what may be termed a pass-through mode. For older USB power sources the voltage $V_{USB}$ may thus be used as the system voltage without any level shifting, which could result, in some cases, the system voltage VP being of the order of 5.5V. For newer USB power sources or wireless charging, the relevant voltage may be stepped down and used as the system voltage but this may also result in a system voltage VP of around 5V or higher.

For the operation of the switching driver 100 described above with reference to FIG. 1, if the capacitor C4 is charged to 2VP in all operating modes, the capacitor C4 should have a voltage rating equal to at least 2VP for the highest expected value of VP. For the example above, where VP can be 5.5V when the power management circuitry is operating in a pass-through mode with an external power source, this would require for the capacitor C4 to have a voltage tolerance of at least 11V. Typically the switching driver would be implemented as an integrated circuit with the flying capacitor C4 as a non-integrated external, i.e. off chip, component and generally, the higher the voltage rating of the capacitor the greater the size and/or cost of the capacitor. For example, capacitors suitable for use as the flying capacitors of the switching driver are generally commercially available with a 10V rating or a 16V rating, with a reasonably significant cost and size differential between the 10V and 16V rated capacitors. For the switching driver previously proposed, for the example voltages discussed, the capacitor C4 would therefore need to be implemented as a 16V rated capacitor.

However, when the system voltage VP is higher, the output voltage range corresponding to each individual driver mode of operation is greater. For instance, if the voltage VP is at a level of, say, 3.5V, such as may be derived from battery at relatively low charge, the maximum magnitude of output drive signal in Mode 4 would be up to 14V (ignoring losses). If, instead, the voltage VP were at 5.5V, such as may be the case when the power management circuit is operating in a pass-through mode, then operating in Mode 3 could provide an output driver signal with a magnitude up to 16.5V. In this case, a given output range that requires the use of Mode 4 to achieve maximum signal peaks when the system voltage VP is at or around 3.5V could be achieved by using Mode 3 for the signal peaks when the voltage VP is at or around 5.5V and thus Mode 4 may not be required. As Mode 4 is the only driver mode that uses the voltage −2VP as a switching voltage, if Mode 4 is not used then the voltage −2VP is not required. In this case, as the voltage −2VP is not used as a switching voltage, the operation of the switching driver 100 may be modified so as to avoid developing the voltage 2VP across the capacitor C4.

Note for the other capacitors, C1, C2 and C3, the voltage across the capacitor is equal to VP in all modes and thus a 10V rated capacitor would be suitable. Capacitors C1 and C2 do experience a voltage of 2VP at one terminal in use, but it is the voltage across the capacitor, i.e. the standoff voltage, that is important for the capacitor voltage rating.

In embodiments of the present disclosure, the switching driver may thus be configured so that the biasing of at least one capacitor—in terms of the ratio of the capacitor voltage to the system input voltage—is varied based on at least one of the magnitude of the system voltage VP or the relevant capacitor voltage. In general, if the system voltage is in a first, lower, range, the switching driver may be operated in a first regime in which, in at least some driver modes, the relevant capacitor is biased according to a first ratio with the system voltage. However, when the system voltage is in a second, higher range, the switching driver may be configured so as to operate according to a second regime so that the ratio of the relevant capacitor voltage to the system voltage is lower than the first ratio, i.e. the ratio value (if expressed as a fraction) is lower than that for the first ratio.

Figure 3:
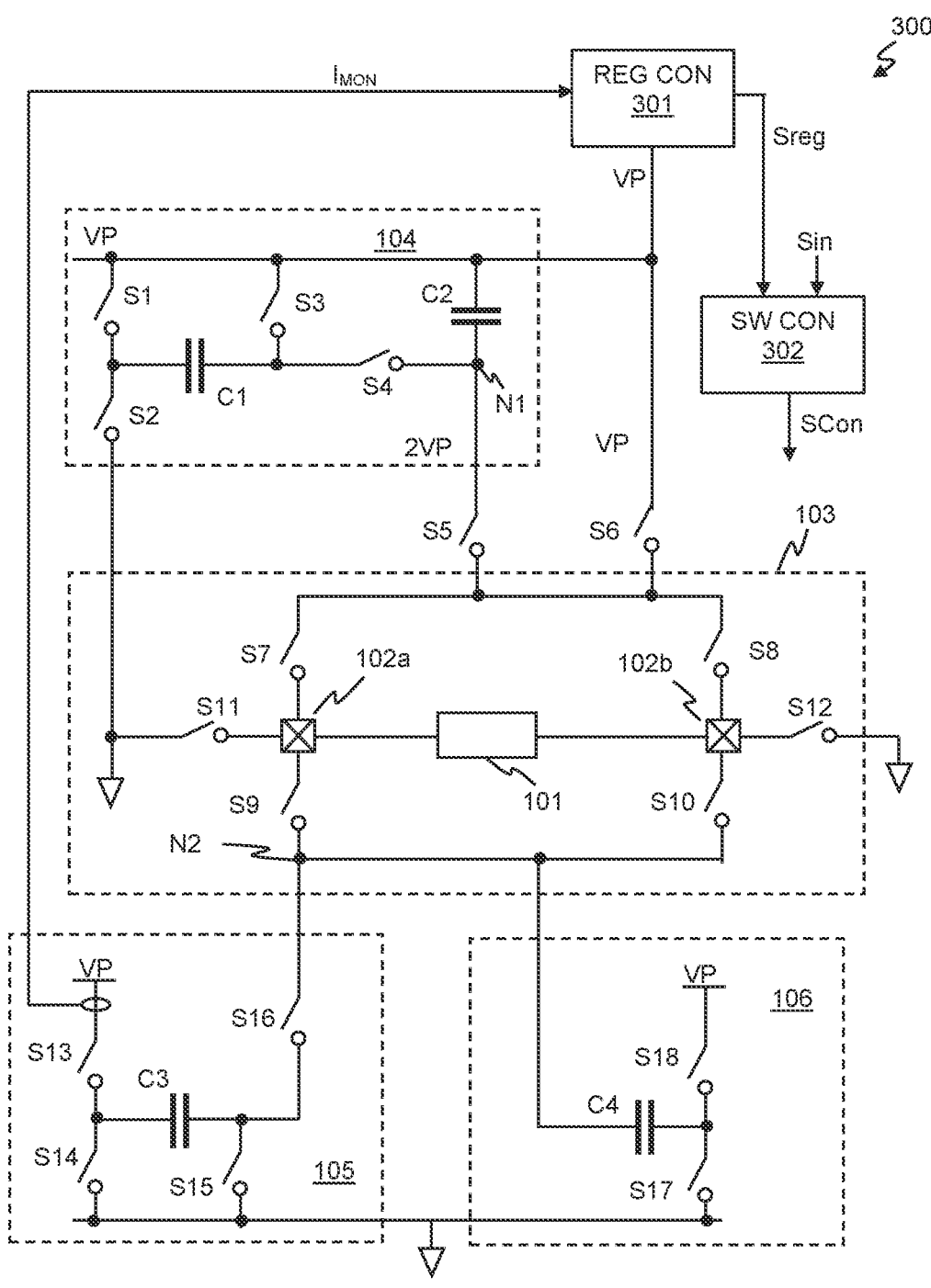
FIG. 3 illustrates an example of a switching driver according to an embodiment.

FIG. 3 illustrates one example of a switching driver 300 according to an embodiment in which similar components as discussed previously are identified by the same reference numerals. In the example of FIG. 3, the switching driver 300 comprises a regime controller 301 configured to control an operating regime for the switching driver 300. The switching driver 300 also comprises a controller 302 for controlling the switches of the switching driver 300 in a similar manner to the switch controller 107 discussed with reference to FIG. 1, but the switch controller 302 is responsive to at least one control signal Sreg from the regime controller 301 so as to operate in a first regime or second regime.

When operating in the first regime, the switch controller 302 is operable to selectively control the switching driver 300 in any of Mode 1, Mode 2, Mode 3 or Mode 4 depending on signal level of the input signal Sin as discussed with reference to FIG. 1. Thus, the switch controller 302 is configured to control the switches in the first regime such that the capacitor C4 is biased (in at least some modes) to a capacitor voltage equal in magnitude to 2VP and the switching driver may be operable in Mode 4 in the first regime to make use of a voltage –2VP as a switching voltage.

However, when operating in the second regime with a relatively high system voltage VP, the switch controller 302 is configured so as to not operate the switching driver 300 in Mode 4. In the second regime, the switch controller 302 is configured to selectively operate in any of Mode 1, Mode 2 or Mode 3 (but not in Mode 4). Further, in each of these modes, the switching driver is operated so that the capacitor C4 has a capacitor voltage with a magnitude which is lower than 2VP (for the present level of VP).

In some implementations, the biasing of the capacitor C4 may be varied, so that the capacitor C4 is biased to a capacitor voltage equal to VP in the second regime. This could be achieved by the switch controller 302 operating to close switch S17 (with S18 open) during the second state of the second capacitive voltage generator 105 when the node N2 is driven to –VP so that a voltage of magnitude VP is developed across capacitor C4. In some implementations, the switch S17 could be closed throughout the switching cycle of the second capacitive voltage generator 105 so that the capacitor C4 effectively acts as a hold or reservoir capacitor for the second capacitive voltage generator 105, although in other implementations the switch S17 could be switched in synchronism with switches S14 and S16. This operation has the advantage of actively controlling the voltage on the capacitor C4.

Alternatively, the voltage across the capacitor C4 could be discharged when operating in the second regime. For instance when the second capacitive voltage generator 105 is in its first state, with switch S15 closed, switches S16 and S17 could be both closed to discharge the capacitor C4 (or there could be one or more additional switches for discharging the capacitor C4). This would however require the capacitor C4 to be completely recharged if and when the regime changes back to the first regime.

As an alternative to deliberately controlling the voltage of the capacitor C4 to have a defined ratio to the system voltage, i.e. to be equal to VP or zero, it would, in some implementations, be possible on a change of operation from the first regime to the second regime to leave the capacitor C4 to simply maintain (subject to leakage) its previous voltage. For example switches S17 and S18 could both be kept open throughout the switching cycle of the second capacitive voltage generator 105. In this case the voltage at the first terminal of capacitor C4 (connected between switches S17 and S18) will be left floating. The voltage of capacitor C4 may thus remain at the same voltage it was on the change from the first regime to the second regime, say at the capacitor voltage of 8.8V from the example above. In this case however as the system voltage has increased to say 5.5V but there is no change in capacitor voltage, the ratio of the capacitor voltage to the system voltage will reduce.

The voltage at node N2 is modulated by the second capacitive voltage generator 105 and the second terminal of the capacitor C4 would simply follow this voltage modulation. The capacitor voltage of capacitor C4 may generally be maintained (although there may be some droop over time due to leakage currents), which can mean that if the regime of operation later switches back to the first regime, the voltage of the capacitor C4 may be closer to the voltage required for the new biasing regime, i.e. 2VP for the new level of VP. In some implementations, however, it may be preferred to avoid such floating voltages.

The switching driver 300 may thus operate in the first regime for a first range of system voltage and in the second regime for a second, higher, range of system voltage. The first range of system voltage may correspond to the expected range of system voltage when the power management circuitry is operating to supply a battery voltage as the supply voltage VP or is actively charging the battery. The second range of system voltage may correspond to the system voltage when the power management circuitry is operating in a pass-through power mode.

The power mode of the power management circuitry 201 could be communicated from the power management circuitry, e.g. via a suitable communications link. This would, however, require an additional integrated circuit (IC) contact, e.g. pad, on the switching driver integrated circuit and in general it is desirable to minimise the number of IC contacts for cost and size reasons. It is therefore preferable that the switching driver 300 be able to determine the correct operating regime itself, e.g. from the received system voltage VP. This avoids the needs for any additional IC contact and can also be safer in ensuring operation in the correct regime.

The regime of operation of the switching driver and hence biasing of the capacitor C4 may thus be controlled by the regime controller 301 based on whether or not the system voltage VP exceeds a threshold. The threshold may be set with respect to a desired output range for the switching driver. For the examples discussed above, the threshold may be set to be higher than the expected maximum voltage when operating based on a battery voltage, e.g. higher than 4.5V. The threshold may also be set with regard to the resulting voltage rating required for the relevant capacitor. As the capacitor can be charged to 2VP for a system voltage VP up to the threshold, the voltage rating for the capacitor should thus be at least twice the value of the threshold. Thus, to enable a 10V rated capacitor to be used, the threshold may be set to be lower than 5V. In other words, the threshold may be set with regard to a limit of capacitor voltage when operating in the first regime. A threshold in the range of about 4.6V to 4.9V could be used in some examples, e.g. a threshold of around 4.7V.

The regime controller 301 may thus receive the system voltage VP (or an indication thereof, e.g. from some low latency voltage monitoring circuitry) and compare it to a relevant threshold to determine whether to operate in the first or second regime.

Figure 4:
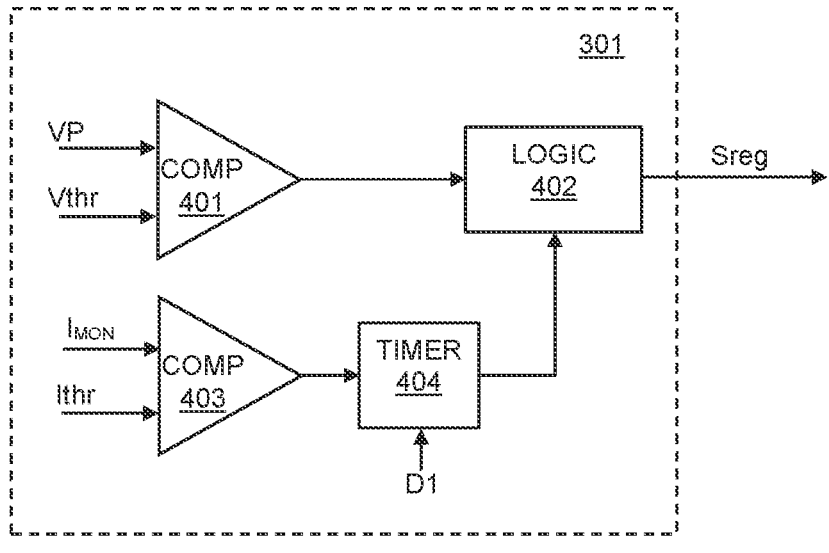
FIG. 4 illustrates one example of a regime controller for controlling an operating regime of the switching driver.

FIG. 4 illustrates one example of a suitable regime controller 301. The regime controller 301 comprises a first comparator 401 for comparing the voltage VP (or indication thereof) to a defined voltage threshold Vthr. The first comparator output is provided to a control block 402, e.g. some control logic, that determines the appropriate regime and generates the at least one control signal Sreg.

To avoid any possible damage to the capacitor C4 the regime controller 301 should respond to any increase in system voltage above the threshold with a relatively low latency.

In practice, the rise of the system voltage VP following a change in power mode of the power management circuitry 201, e.g. a change to a pass-through power mode, is not instantaneous. For instance, bulk capacitance between the power management circuitry 201 (and/or the relevant charger 204 or 205) and the switching driver 100 means that the change in system voltage will be smoothed. The maximum expected slew-rate of such an increase in the system voltage VP may depend on the particular application, but, in general, there will be a period of time between the system voltage VP reaching the threshold and the system voltage subsequently reaching a level at which the relevant capacitor may be damaged if biased with the first ratio, and this period of time can be sufficient to detect the threshold crossing and change the biasing regime. In at least some examples, the maximum relevant slew-rate of the system voltage may be about 100 mV/us. For a threshold of around 4.7V and a safe limit for the capacitor C4 of about 5V, the latency of the first comparator 401 and the control block 402 with respect to the input system voltage reaching the voltage threshold and the control block outputting a control signal to control the switching driver to operate in the second remine, e.g. a group delay through the comparator 401 and associated control logic 402, may be configured to be of the order of 2 us or less, or 1 us or less.

The regime controller 301 may thus be configured to respond quickly to any increase in system voltage VP above the threshold, to signal a change from the first regime to the second regime so as to avoid damage to the capacitor C4 from the increase in system voltage. The switch controller 302 is responsive to the control signal(s) Sreg from the regime controller to disable the use of Mode 4 and to change the switching of capacitor C4 so as to change the biasing of this capacitor as discussed above. If the switching driver is actually operating in Mode 4 at the point of the change of regime to the second regime, the switch controller 302 will, at that point swap to operating in the next highest mode (in terms of output range), which in this case is Mode 3. The control signal(s) Sreg thus causes the switch controller 302, on a change to the second regime, to disable the use of Mode 4 and control the switching of capacitor C4 in the other modes to implement the changed biasing. As the use of Mode 4 is disabled, a signal limit for the maximum input allowed to a quantizer of the switch controller 302 may also be updated.

For a change from the second regime to the first regime, the regime controller 301 may be configured to not change to the first regime only because the system voltage drops below the threshold.

Under high load conditions, the switching driver 300 may draw a relatively high input current from the supply input for the system voltage VP and the resulting IR drop due (at least partly) to external trace resistance may result in the monitored system voltage dropping below the threshold. However, the nominal level of the system voltage VP may still be relatively high. If the loading then changed relatively suddenly, e.g. there were a load dump, this could lead to a relatively fast increase in system voltage VP. The latency of the comparator 401 and control logic 402 may be insufficient for the regime controller 301 to be able to respond to such a rapid change in system voltage VP before a potentially dangerous over-voltage condition could occur for the capacitor C4.

Therefore, in some implementations, the regime controller 301 may be configured to avoid changing to the first regime in response to drops in the system voltage due to loading.

The regime controller 301 could be implemented so as to only to change to the first regime if the system voltage VP remains below the threshold for a defined period of time, which may be longer than would be expected for any high loading event. In the example of FIG. 4, however, the regime controller is configured to take an indication of loading into account. The regime controller 301 may thus be configured to control the switching driver 300 to swap to the first regime, only if the indication of the system voltage VP drops below the voltage threshold and also an indication of loading of the switching driver does not exceed a loading threshold.

The regime controller 301 of FIG. 4 is configured to monitor a current which is indicative of loading of the switching driver 300 and thus receives an indication $I_{MON}$ of the monitored current. In some cases, the monitored current could be an indication of the output current to the load, but in some cases the monitored current could be (as illustrated in FIG. 3) the input supply current to the switching driver. The indication $I_{MON}$ of the monitored current may be determined by any suitable current sensing circuitry, e.g. using one or more sense resistors, as will be understood by one skilled in the art.

The regime controller 301 is configured to only change from the second regime to the first regime if the indication of monitored current $I_{MON}$ remains below a defined current threshold Ithr for a defined duration D1. The current threshold Ithr and duration D1 may be defined for a particular application and/or in some implementations at least one of the current threshold Ithr and duration D1 may be programmable. The regime controller 301 of the example of FIG. 4 thus comprises a comparator 403 for comparing the indication $I_{MON}$ of monitored current against the current threshold Ithr and a timer 404 responsive to the comparator 403 for determining whether the comparator output indicates the monitored current $I_{MON}$ is below the current threshold for the duration D1. This may be taken as an indication that the switching driver is not operating under high loading conditions and thus a load dump condition resulting in a dangerous over-voltage on the capacitor C4 is not likely.

The control logic 402 may thus be responsive to the output of the timer 404 and, when operating in the second regime, may be configured to only change to the first regime if both the comparator 401 indicates that the system voltage has dropped below the voltage threshold Vthr and the monitored current $I_{MON}$ has been below the current threshold Ithr for the defined duration D1. In some examples the control logic may implement a suitable state machine as would be understood by one skilled in the art. On a change from the second to the first regime, the switch controller 302 may be configured to enable use of Mode 4 and to change the biasing of the capacitor C4 so that it is biased to the voltage 2VP. The limit for the input to the quantizer may also be updated to take account of the ability to use Mode 4.

In the example of FIGS. 3 and 4 the regime controller 301 is configured to monitor the system voltage VP against the voltage threshold. It would alternatively or additionally be possible to monitor the capacitor voltage of the relevant capacitor C4 against a threshold for the capacitor voltage which is set at an appropriate level with regard to the voltage rating of the capacitor.

It will be noted that the discussion above has focussed on one particular example of a switching driver with capacitive voltage generation which is operable with some specific driver modes of operation but it should be understood that embodiments could be implemented using switching drivers with different switching topologies and/or which are operable in at least some different driver modes and/or with different switching voltages.

In general, embodiments relate to a switching driver with capacitive voltage generation, wherein an input system supply voltage for the switching driver may vary in use, in particular due to the host device (which includes the switching driver) operating in different power modes, such as deriving the system input voltage from different possible power sources.

The switching driver is operable in a first regime in which, in at least one driver mode of operation a first capacitor is biased to a capacitor voltage with a magnitude greater than the input supply voltage and which has a first ratio to the magnitude of input supply voltage, i.e. the first ratio of the magnitude of nominal capacitor voltage to the magnitude of the input supply voltage is X:1, where X is greater than 1. In at least some examples the first capacitor may be biased in the first regime to a capacitor voltage with a magnitude which is a multiple greater than one of the system input voltage, i.e. X may be an integer greater than 1. The switching driver is also operable in a second regime in which the biasing of the first capacitor is different to that of the first regime, such that the first capacitor has a capacitor voltage with a magnitude that has a ratio to the input supply voltage which is lower than the first ratio, i.e. in the second regime the ratio of the capacitor voltage to the input supply voltage is Y:1, where Y is lower than X. In some implementations the first capacitor may be biased in the second regime to have a capacitor voltage which is of the same magnitude as the system input voltage.

It should also be understood that the various example numbers or ranges for possible system voltages, capacitor voltages, voltage ratings, slew rates and group delays etc. are given by way of example only for the purposes of explanation. Whilst the example figures given are valid for some applications, it will be understood that other applications may use different components and different figures would apply.

It should further be noted that references to the capacitors being biased to a voltage of VP or 2VP, or more generally to being a multiple or having a define ration with the system voltage VP, refers to the nominal capacitor voltage under ideal conditions and no loading. It will be understood that in use in a practical system the actual voltage across the capacitor may vary from this nominal value in use, e.g. due to losses or loading etc.

The examples above have been discussed in the context of driving a transducer, which may in particular be an audio transducer, and embodiments of the present disclosure may advantageously be used in audio application or other applications for driving a transducer, e.g. such as haptic output transducer. However embodiments of switching drivers may be used for driving other types of transducer or other loads.

Embodiments of the switching driver may be implemented as an integrated circuit, although at least some components, such as the capacitors, may be external, off-chip components that. Embodiments may be implemented in a host device, especially a portable and/or battery powered host device such as a mobile computing device for example a laptop, notebook or tablet computer, or a mobile communication device such as a mobile telephone, for example a smartphone. The device could be a wearable device such as a smartwatch. The host device could be a games console, a remote-control device, a home automation controller or a domestic appliance, a toy, a machine such as a robot, an audio player, a video player. It will be understood that embodiments may be implemented as part of a system provided in a home appliance or in a vehicle or interactive display. There is further provided a host device incorporating the above-described embodiments.

The skilled person will recognise that some aspects of the above-described apparatus and methods, for instance for determining the operating regime and/or switching control, for example on a non-volatile carrier medium such as a disk, CD- or DVD-ROM, programmed memory such as read only memory (Firmware), or on a data carrier such as an optical or electrical signal carrier. For some applications, embodiments may be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. S Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A switching driver for driving a load with an output drive signal based on an input signal comprising:
   a supply input node configured to receive an input supply voltage that can vary in use;
   an output stage configured to switch at least one driver output node between selected switching voltages with a controlled duty-cycle so as to generate the output drive signal at the at least one driver output node, wherein the output stage is operable in a plurality of different driver modes in which the switching voltages are different in the different driver modes;
   a capacitive voltage generator comprising capacitor nodes for connection, in use, to a capacitor, the capacitive voltage generator being operable to generate one of the switching voltages used in one of the driver modes, wherein the switching driver is configured to be operable:
   in a first regime in which, in at least one driver mode, the capacitor is biased to a capacitor voltage with a magnitude greater than the input supply voltage and which has a ratio to the magnitude of the input supply voltage with a first value; and
   in a second regime in which the biasing of the capacitor is different to that of the first regime, such that the capacitor voltage has a magnitude that has a ratio to the input supply voltage with a value which is lower than the first value;
   wherein the capacitor has a voltage rating for a safe operating voltage such that, if the switching driver were operated in the first regime for a maximum expected value of input voltage, the capacitor voltage would exceed the voltage rating; wherein the switching driver comprises a regime controller configured to control the regime of the switching driver, so as to selectively operate in the first regime or the second regime, based on at least one of the magnitude of the input supply voltage and the magnitude of the capacitor voltage so as to maintain the capacitor voltage within the voltage rating of the safe operating voltage.

2. The switching driver of claim 1 further comprising at least one additional capacitive voltage generator comprising at least one additional capacitor, wherein the switching driver is configured such that the at least one additional capacitor is biased to a voltage with a magnitude equal to the magnitude of the input supply voltage in each of the first regime and the second regime.

3. The switching driver of claim 1 configured as an audio driver, wherein the output drive signal is an audio output signal and the load is an audio output transducer.

4. The switching driver of claim 1 implemented as an integrated circuit.

5. An electronic device comprising:
   the switching driver of claim 1; and
   a power management circuitry configured to provide the input supply voltage for the switching driver;
   wherein the power management circuitry is configured to be operable in a first power mode in which the input supply voltage for the switching driver is derived from a battery of the electronic device and is in a first voltage range and in a second power mode in which the input supply voltage for the switching driver is derived from a power source external to the electronic device and is in a second voltage range, higher than the first voltage range; and
   wherein the regime controller is configured to control the switching driver to operate in the first regime when the power management circuitry is operating in the first power mode and to control the switching driver to operate in the second regime when the power management circuitry is operating in the second power mode.

6. The electronic device of claim 5 wherein the second power mode is a pass-through power mode in which a voltage derived from the power source external to the electronic device is used to provide the input supply voltage for the switching driver without charging the battery.

7. The switching driver of claim 1 wherein the regime controller is configured to control the regime of the switching driver based on the magnitude of the input supply voltage and the regime controller comprises a first comparator for comparing an indication of the input supply voltage to a voltage threshold and a control block responsive to the first comparator for outputting a regime control signal to control the regime of the switching driver.

8. The switching driver of claim 7 wherein the regime controller is configured to control the switching driver to operate in the second regime if the indication of the input supply voltage exceeds the voltage threshold.

9. The switching driver of claim 8 wherein a latency of the first comparator and the control block with respect to the input system voltage reaching the voltage threshold and the control block outputting a control signal to control the switching driver to operate in the second regime is 2 microseconds or less.

10. The switching driver of claim 7 wherein the regime controller is configured such that, when operating in the second regime, the regime controller controls the switching driver to swap to the first regime, if the indication of the input supply voltage drops below the voltage threshold and also an indication of loading of the switching driver does not exceed a loading threshold.

11. The switching driver of claim 7 wherein the regime controller is further configured to receive an indication of a monitored current, wherein the monitored current is one of an input current to the switching driver from the supply input node or an output current from the switching driver to the load, and wherein the regime controller is configured to control the switching driver to swap from the second regime to the first regime if the indication of the input supply voltage drops below the voltage threshold and also the indication of monitored current does not exceed a current threshold for a defined time period.

12. The switching driver of claim 11 wherein the regime controller further comprises a second comparator for comparing the indication of monitored current to the current threshold and a timer for timing the defined time period.

13. The switching driver of claim 1 wherein the switching driver is configured such that, in the first regime, the capacitor is biased to a capacitor voltage with a magnitude which is a multiple, greater than one, of the magnitude of the input supply voltage.

14. The switching driver of claim 13 wherein the switching driver is configured such that, in the first regime, the capacitor is biased to a capacitor voltage with a magnitude which is twice the magnitude of the input supply voltage.

15. The switching driver of claim 14 wherein the switching driver is configured such that, in the first regime, the capacitive voltage generator is operable to generate a voltage equal to $-2$ VP for use as one of the switching voltages.

16. The switching driver of claim 13 wherein the switching driver is configured such that, in the second regime, the capacitor is biased to a capacitor voltage with a magnitude equal to the magnitude of the input supply voltage.

17. The switching driver of claim 13 wherein the switching driver is configured such that, in the second regime, the capacitor maintains its previous voltage from a period of operation in the first regime.

18. The switching driver of claim 13 wherein the switching driver is configured such that, in the second regime, the capacitor is biased to a capacitor voltage of zero.

19. A switching driver for driving a load with an output drive signal based on an input signal comprising:

a supply input node configured to receive an input supply voltage that can vary in use; and an output stage configured to switch at least one driver output node between selected switching voltages with a controlled duty-cycle so as to generate the output drive signal at the at least one driver output node, wherein the output stage is operable in a plurality of different driver modes in which the switching voltages are different in the different driver modes;

wherein the switching driver comprises a capacitor configured as part of a capacitive voltage generator for generating a voltage that can be used as a switching voltage, wherein, in use, the capacitor is biased to a capacitor voltage and the capacitor has a voltage rating for a safe operating voltage; and wherein the switching driver is configured such that biasing of the capacitor is dynamically varied in use based on the magnitude of the input supply voltage to vary the relationship between the capacitor voltage and the input supply voltage to maintain the magnitude of the capacitor voltage below the voltage rating.

20. A switching driver for driving a load with an output drive signal based on an input signal comprising:

an output stage configured to switch at least one driver output node between selected switching voltages with a controlled duty-cycle so as to generate the output drive signal at the at least one driver output node, wherein the switching driver comprises a capacitor configured as part of a capacitive voltage generator for generating a voltage that can be used as a switching voltage;

wherein the switching driver is configured to be operable:

in a first regime in which the capacitor is biased to a capacitor voltage such that a ratio of the capacitor voltage to an input supply voltage has a first value; and in a second regime in which a ratio of the capacitor voltage to the input supply voltage has a value lower than the first value;

wherein the capacitor has a capacitor voltage limit for a safe operating voltage such that, if the switching driver were operated in the first regime for a maximum expected value of input voltage, the capacitor voltage would exceed the capacitor voltage limit; and wherein the switching driver is configured to selectively operate in the first regime or the second regime based on whether the capacitor voltage when operating in the first regime would exceed the capacitor voltage limit, so as to maintain the capacitor voltage within the voltage rating of the safe operating voltage.

* * * * *